United States Patent [19]

Konshak

[11] Patent Number: 4,523,254
[45] Date of Patent: Jun. 11, 1985

[54] EQUIPMENT MODULE

[75] Inventor: Michael V. Konshak, Colorado Springs, Colo.

[73] Assignee: Magnetic Peripherals Inc., Minneapolis, Minn.

[21] Appl. No.: 566,470

[22] Filed: Dec. 28, 1983

[51] Int. Cl.³ ............................................. H05K 7/16
[52] U.S. Cl. .................................... 361/391; 361/395
[58] Field of Search ................... 108/61; 211/41, 84;
312/119, 120, 294, 320, 322; 73/431; 339/18 B;
361/380, 338, 390, 339, 391, 393, 394, 395, 399,
412, 413, 415, 420, 429

[56] References Cited

U.S. PATENT DOCUMENTS

| | | | |
|---|---|---|---|
| 2,584,173 | 2/1952 | Fowler | 361/391 |
| 3,857,992 | 12/1974 | Lehmann | 361/391 |
| 4,227,237 | 10/1980 | Matthews et al. | 361/391 |
| 4,268,100 | 5/1981 | Keltas et al. | 361/391 |
| 4,287,764 | 9/1981 | Staab et al. | 73/431 |

Primary Examiner—A. D. Pellinen
Assistant Examiner—Gregory D. Thompson
Attorney, Agent, or Firm—Edward P. Heller, III; Joseph A. Genovese

[57] ABSTRACT

An equipment module for holding printed circuit boards. The equipment module contains pin and slot combinations which permit it to be lifted from a casing and tilted for efficient access to the printed circuit boards for maintenance. The pin and slot combinations comprise a plurality of slots molded into the sides of the equipment module for cooperation with pins mounted on the casing.

2 Claims, 6 Drawing Figures

EQUIPMENT MODULE

BACKGROUND OF THE INVENTION

1. Field of the Invention

The invention relates generally to the field of equipment modules for mounting printed circuit boards and more specifically to means for mounting said equipment module in a casing.

2. Brief Description of the Prior Art

Equipment modules for mounting printed circuit boards are known in the art. These modules essentially comprise racks into which printed circuit boards are slidably mounted. The module is then mounted into a device which uses the electronics of the printed circuit board.

Due to the limited space in which equipment modules are sometimes mounted, maintenance is inhibited due to limitations on access to the printed circuit boards. The art has attempted to increase access to these printed circuit boards by various means and methods. Some of these means include pivot means by which the module may be pivoted into a position providing access to the printed circuit boards. See, e.g., Staab et al, U.S. Pat. No. 4,287,764; Kekas et al, U.S. Pat. No. 4,268,100; and Matthews et al, U.S. Pat. No. 4,227,237. The latter of these references Matthews '237, further includes pin and slot combinations for maintaining the pivoted equipment module in both the up and the down positions.

The prior art has also included pin and slot combinations for pivoting and/or removing a front panel to permit access to the printed circuit boards. See, e.g., Fowler, U.S. Pat. No. 2,584,173.

The prior art has not shown means for mounting an equipment module which provides for efficient access to the printed circuit boards where the equipment module is substantially cubical and where it is mounted in a casing which does not permit significant horizontal movement of the equipment module. In this environment, pivoting the module will not permit sufficient access to the printed circuit boards. Further, the prior art devices do not permit access both to the front and back of the equipment module or permit removal of the module from the casing entirely without releasing fasteners.

SUMMARY OF THE INVENTION

The invention comprises an equipment module having two side braces and top and bottom transverse support members. The side braces have a plurality of slots on their interior surfaces. Printed circuit boards are slidably mounted in the slots. Additionally, each side brace has two slots mounted on their exterior surfaces. Each of said slots has a vertically extending portion and a horizontally extending portion at the lower end of the vertically extending portion. The rear slot of the two is somewhat shorter than the forward slot. Four pins are mounted on the casing into which the equipment module is mounted, two pins on each of two opposed walls. All four pins are mounted in horizontal planar alignment near the top of the casing. The pins cooperate with the four slots mounted on the outer surfaces of the two side braces of the equipment module. The horizontal extending slots permit the module to be mounted on or removed from the pins and as well permit the equipment module to be rested in a raised stationary position, tilted up to permit efficient access to the printed circuit boards. The vertical slots permit the equipment module to be lowered into the casing.

DESCRIPTION OF THE PREFERRED EMBODIMENT

Figure 1:
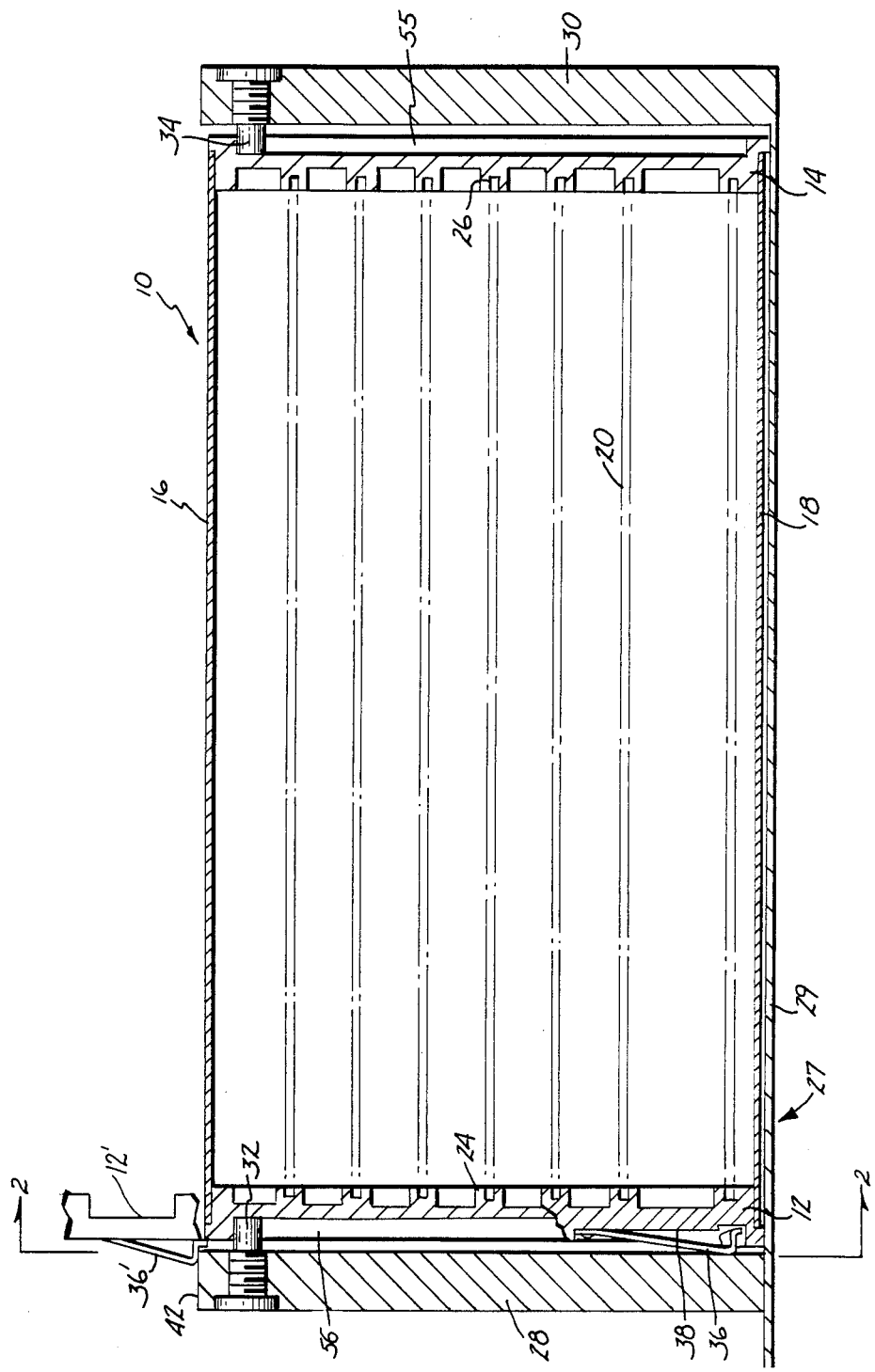
FIG. 1 is a front plan view of the equipment module in a casing with a plurality of printed circuit boards mounted in the equipment module.

FIG. 1 is a front plan view of a preferred embodiment of the equipment module 10 according to the present invention. The equipment module 10 is comprised of lateral side braces 12 and 14 and top and bottom transverse support members 16 and 18. The lateral side braces 12 and 14 are preferably of molded plastic while the transverse support members 16 and 18 are preferably composed of a metal. The support members 16 and 18 may be fastened to the lateral side members 12 and 14 by means of suitable fasteners such as screws. Molded on the interior surfaces of lateral side braces 12 and 14 are a plurality of slots 24 and 26 between which printed current boards 20 may be slidably inserted and mounted.

Figure 2:
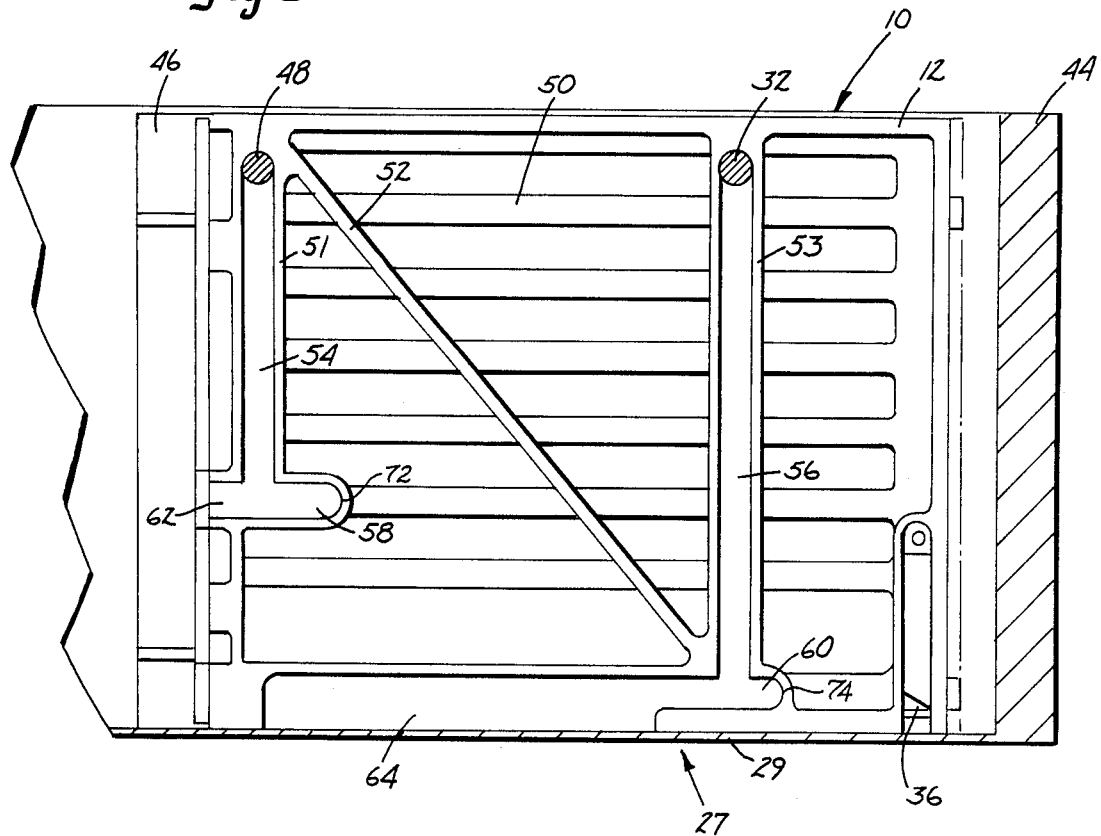
FIG. 2 is a view along 2—2 of FIG. 1.

The equipment module 10 is mounted in a casing 27 of which lateral side walls 28 and 30 and bottom plate 29 are shown in the Figure. Mounted near the top of casing side walls 28 and 30 are pins 32 and 34 respectively. Two more pins, one of which is shown at 48 in FIG. 2, are mounted on side walls 28 and 30 toward the rear of casing 27 in a horizontal plane passing through pins 32 and 34. Pins 32, 34, 48 and the fourth pin (not shown) cooperate with forward slots 56, 55 shown in FIG. 1, rearward slot 54 shown in FIG. 2 and a rearward fourth slot (not shown). This rearward fourth slot is identical to slot 54 and is mounted on side brace 14 in a vertical plane passing through the vertically extending portion of rearward slot 54 and parallel to front and back casing walls 44 and 66 shown in FIGS. 2 and 3a–d. Also shown in FIG. 1 is an optional spring-loaded latch 36 mounted in a recess 38 formed in side brace 12. A similar optional latch (not shown) is mounted in side brace 14 but has been omitted from the figure for the purpose of clarity. This latter latch is identical to latch 36 and is mounted on side brace 14 in a location corresponding to the location of latch 36 on side brace 12. When the equipment module 10 is raised to its raised position as shown in FIG. 1, these latches spring outwards to engage the top 42 of the casing side walls 28 and 30. The leftmost latch 36' and brace 12' are shown engaging the top 42 of sidewall 28 at the upper leftmost portion of FIG. 1 when the equipment module 10 is in a raised position.

FIG. 2 shows a section along 2—2 of FIG. 1. Mounted on side brace 12 are a plurality of horizontal struts 50 upon which are mounted the slots 24 as shown in FIG. 1. Mounted across these horizontal struts 50 are vertical struts 51 and 53 and a diagonally transverse strut 52 connecting vertical struts 51 and 53. Mounted in the vertical struts 51 and 53 are recesses or slots 54, 56 having horizontal extensions 58 and 60. The top of slots 54 and 56 are closed. The rightmost ends 72, 74 of horizontal extensions 58 and 60 are closed while the leftmost ends 62, 64 of the extensions are open. Also shown in the figure are pins 32 and 48 which are slidably engaged with slots 54 and 56 when the equipment module 10 is mounted in casing 27.

Also shown in FIG. 2 is latch 36 and a pin connector 46. Pin connector 46 couples to the pins of the respective printed circuit boards. Connector 46 will typically also have a cable interconnecting the equipment module 10 with other electronic components of the device in which the equipment module is mounted, as is known in the art.

The structure of side brace 14 is identical to the structure of side brace 12, save for it being a mirror image thereof. A description of its structure herein would be redundant.

The operation of equipment module 10 is shown in FIGS. 3a through 3d. Detail unnecessary for interpretation of the operation have been omitted from these drawings for purposes of clarity. Casing front wall 44 and casing rear wall 66 are partially shown to help better to understand the motion of equipment module 10.

Figure 3A:
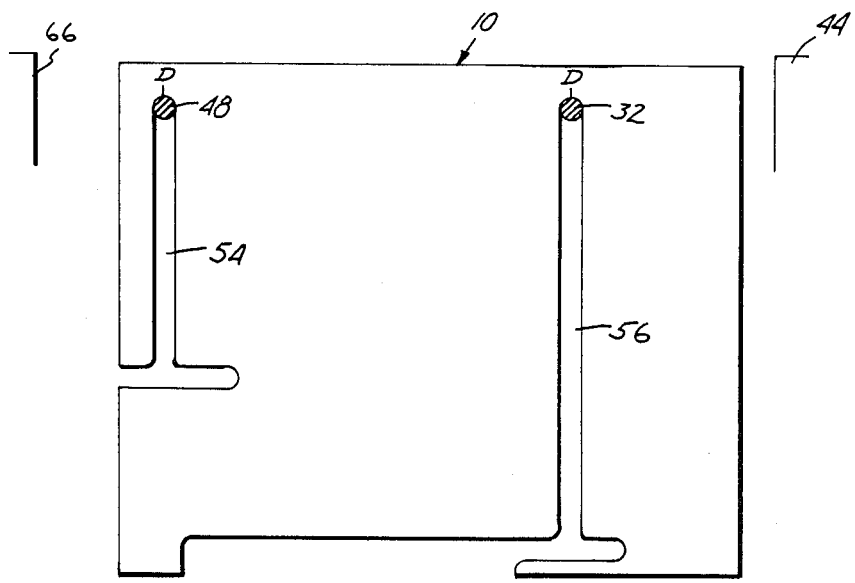
FIGS. 3a through 3d show the relative movement of the equipment module as it is raised from its casing to a tilted raised position.
Figure 3B:
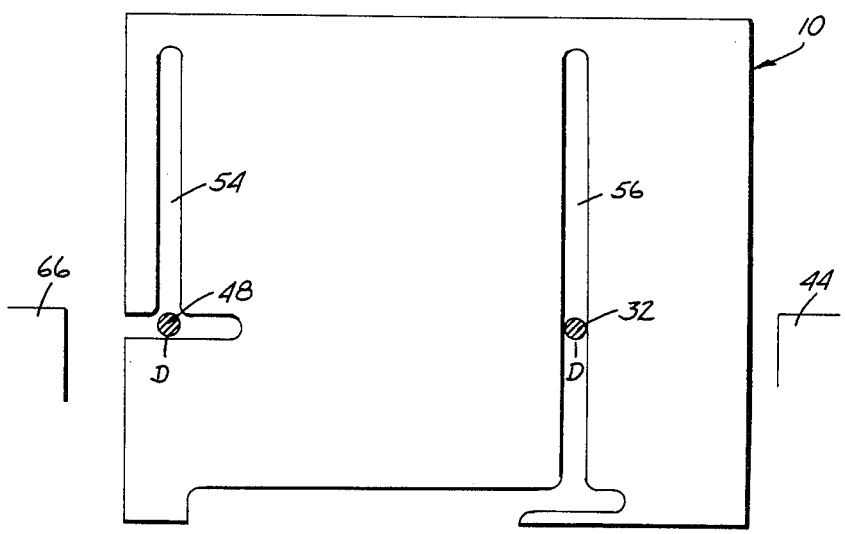
Figure 3C:
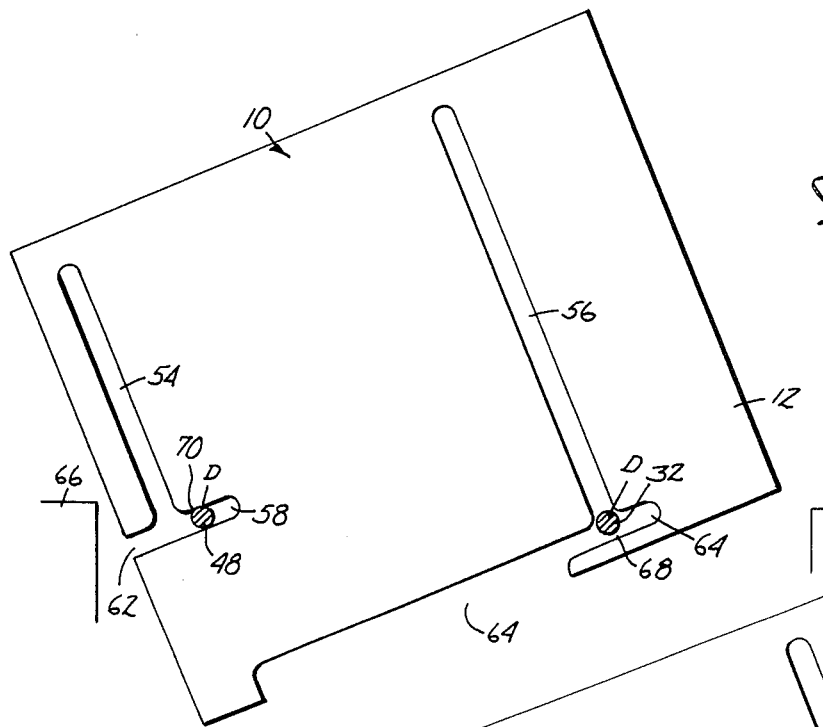

FIG. 3b shows the equipment module 10 in a lowered position relative to casing 27. In this position front and rear pins 32 and 48 abut against the top of forward and rearward slots 56 and 54. Note that as the pins 32 and 48 are fixedly mounted on casing 27, the distance between the pins D—D in the figure, remains constant.

To place the equipment module in a position for servicing, the module 10 is initially raised vertically a distance equal to the length of rearward slot 54, as shown in FIG. 3b. At this position front pin 32 rests at an intermediate position between the top and the bottom of the vertically extending portion of forward slot 56.

Figure 3D:
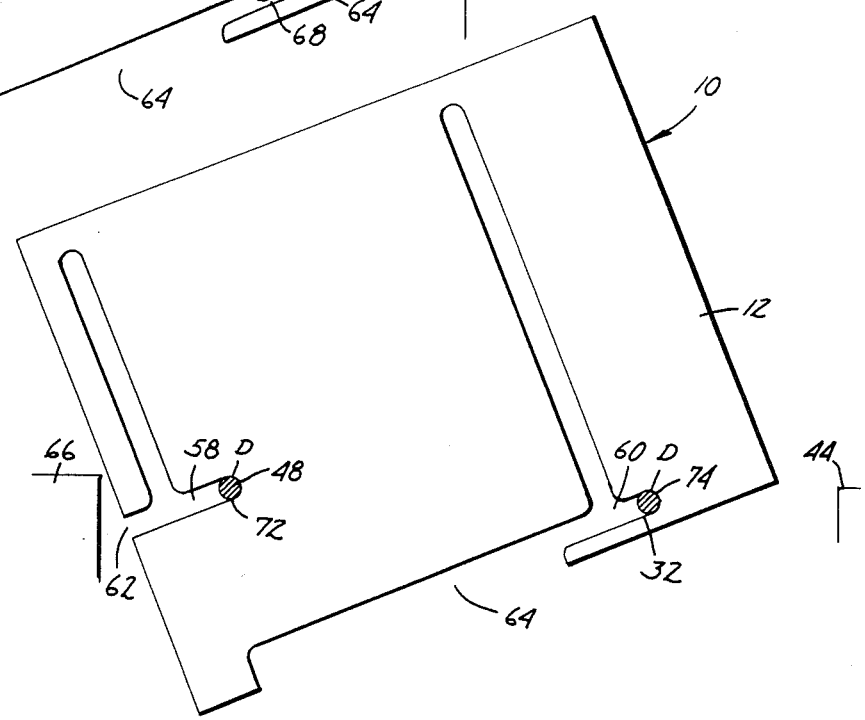

From this position, the equipment module 10 is then pivoted on the rearward pin 48 while the front pin 32 continues to slide down forward slot 56. The distance D—D in the figure remains fixed. In order to accomplish this pivoting rear pin 48 slides a short distance up horizontal extension 58 reaching a point 70 when forward pin 32 reaches the bottom 68 of the vertically extending portion of forward slot 56. At this juncture, equipment module 10 may be removed from the casing 27 by sliding the equipment module forward such that the pins 48 and 32 exit through the open ends 62 and 64 of the horizontal extensions; or the equipment module may be moved in a rearward direction into a resting position as shown in FIG. 3D where pins 48 and 32 abut against the ends 72 and 74 of extensions 58 and 60 thereby arresting the motion of equipment module 10 and allowing it to remain in a stationary raised position. From this position the printed circuit boards may be removed from equipment module 10 without obstruction from casing 27. Further there is easy operator access to the rear of the equipment module 10 so as to unplug a connector 46 if necessary. When the connector 46 is unplugged the entire equipment module may be removed from the casing 27. It is noteworthy that for this removal nothing in the equipment module 10 or the casing 27 must be disassembled.

The enumeration of the various elements of the preferred embodiment should not be taken as a limitation on the scope of the appended claims, in which I claim:

1. Apparatus for mounting a substantially cubical equipment module in a casing comprising:
   a substantially cubical equipment module comprising:
   a housing having two opposed vertically disposed mounting means for mounting printed circuit boards therebetween, the mounting means having top, rear and bottom edges;
   a forward slot formed on the exterior of each of said mounting means, said slot having a vertical portion extending from adjacent the top edge of the mounting means to adjacent the bottom edge and an intersecting lower horizontal portion, the forward end of the horizontal portion being closed and the rearward end of the horizontal portion being open and communicating with the bottom edge of the mounting means;
   a rearward slot formed on the exterior of each of said mounting means, said rearward slot having a vertical portion, shorter than the vertical portion of the foward slot, extending from adjacent the top edge of the mounting means and an intersecting lower horizontal portion, the forward end of the horizontal portion being closed and the rearward end of the horizontal portion being open and communicating with the rear edge of the mounting means;
   casing means for mounting therein said equipment module comprising:
   two vertically disposed opposed walls each having a forward and a rearward pin mounted adjacent the top of the walls and spaced from each other a distance equal to the distance between the centers of the corresponding forward and rearward vertical slots, the pins further sized to fit into the corresponding forward and rearward slots, the two opposed casing walls further spaced from each other such that when the equipment module is inserted into the casing, the pins slide into their corresponding slots via the communicating open ends of the slots, each rearward pin sliding in via the open ends of the corresponding horizontal portions of the rearward slots at the rear edges of each mounting means, and each forward pin sliding in via the open ends of the corresponding horizontal portions of the forward slots at the bottom edges of each mounting means;
   the closed ends of the horizontal portions of the forward and rearward slots comprising abutment means for holding the equipment module in a raised and tilted position;
   the vertical portions of the forward and rearward slots comprising means for lowering or raising the equipment module vertically into or out of the casing to or from an ultimate mounted position; and
   the open ends of the horizontal slots comprising further means for slidably removing the equipment module from engagement with their corresponding pins and thereafter from the casing from a tilted and raised position.

2. The apparatus for mounting an equipment module in a casing of claim 2 further comprising:
   one or more biased latch means, mounted on the lower portion of the exterior of said mounting means, for assisting in maintaining said equipment module in said raised and tilted position.

* * * * *